United States Patent [19]

Ichihara et al.

[11] Patent Number: 5,607,599
[45] Date of Patent: Mar. 4, 1997

[54] METHOD OF PROCESSING A MAGNETIC THIN FILM

[75] Inventors: Katsutaro Ichihara, Yokohama; Michiko Okubo, Kawasaki; Keiji Horioka, Yokohama, all of Japan

[73] Assignee: Kabushiki Kaisha Toshiba, Kawasaki, Japan

[21] Appl. No.: 558,507

[22] Filed: Nov. 16, 1995

[30] Foreign Application Priority Data

Nov. 17, 1994 [JP] Japan ................................. 6-283068
Mar. 31, 1995 [JP] Japan ................................. 7-074319

[51] Int. Cl.$^6$ .............................. G11C 11/14; C23F 1/12
[52] U.S. Cl. .................... 216/22; 156/643.1; 156/646.1; 216/67; 216/75; 365/171
[58] Field of Search ........................ 216/66, 67, 75, 216/22; 156/643.1, 646.1

[56] References Cited

U.S. PATENT DOCUMENTS

| | | | |
|---|---|---|---|
| 4,439,294 | 3/1984 | Bril et al. | 216/75 |
| 4,505,782 | 3/1985 | Jacob et al. | 156/643.1 |
| 5,277,750 | 1/1994 | Frank | 156/643.1 |
| 5,384,009 | 1/1995 | Mak et al. | 156/643.1 |

FOREIGN PATENT DOCUMENTS 3-97877  4/1991  Japan .
4-129014  4/1992  Japan .

OTHER PUBLICATIONS

M. J. Vasile, et al., "Chemically Assisted Sputter Etching of Permalloy Using Co or $Cl_2$", J. Vac. Sci. Technol., A4 (4), Jul./Aug. 1986, pp. 1841–1849.

Keizo Kinoshita, et al., "Reactive Ion Etching of Fe–Si–Al Alloy For Thin Film Head", IEEE Transactions on Magnetics, vol. 27, No. 6, Nov. 1991, pp. 4888–4890.

Primary Examiner—T. Tung
Attorney, Agent, or Firm—Oblon, Spivak, McClelland, Maier & Neustadt, P.C.

[57] ABSTRACT

Disclosed is a method of processing a magnetic thin film, comprising the steps of disposing a mask having a predetermined pattern on a magnetic thin film consisting of a magnetic material containing at least one element selected from the group consisting of Fe, Co and Ni, supplying a reactive gas containing activated $BCl_3$ to an exposed portion of said magnetic thin film and allowing said reactive gas to react with said magnetic material, and removing the magnetic thin film of the exposed portion to perform a desired patterning.

18 Claims, 4 Drawing Sheets

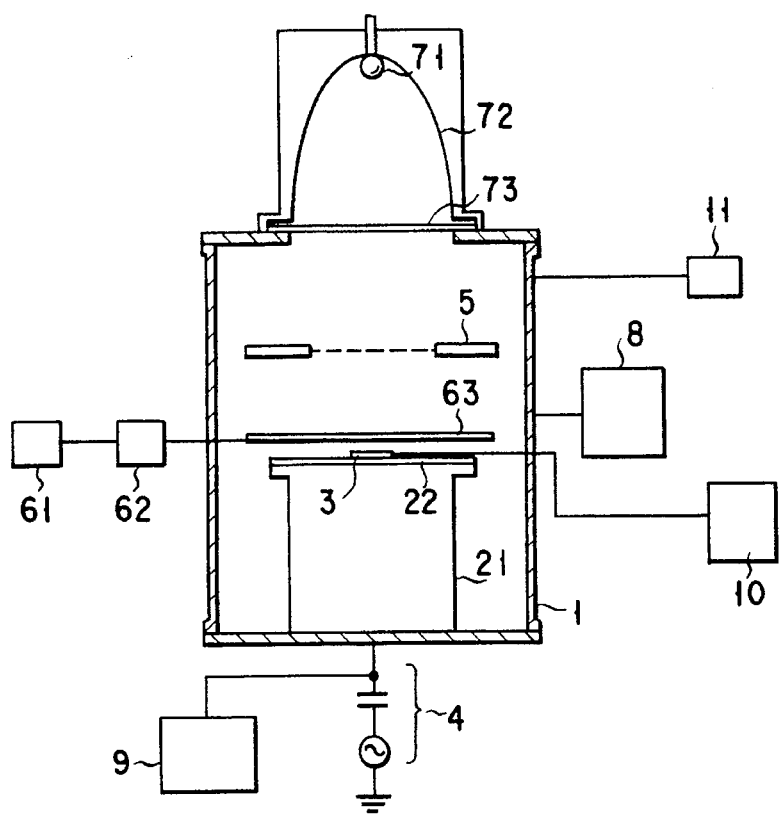
F I G. 1
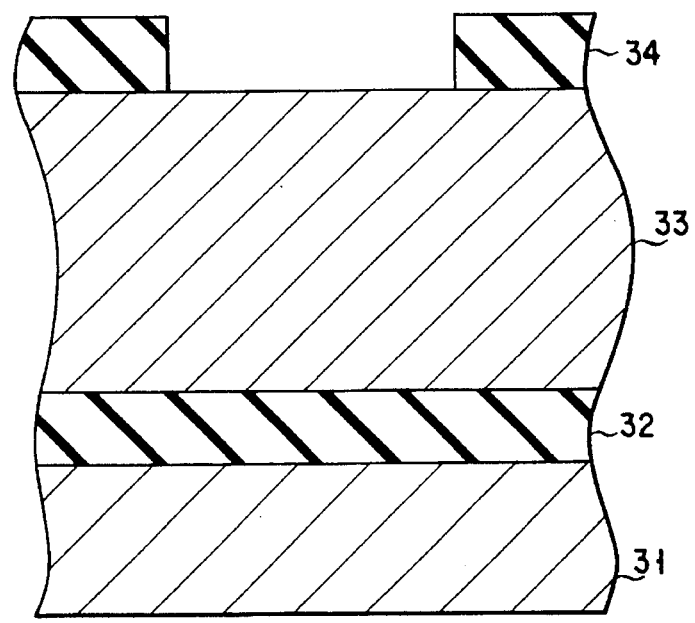
F I G. 2

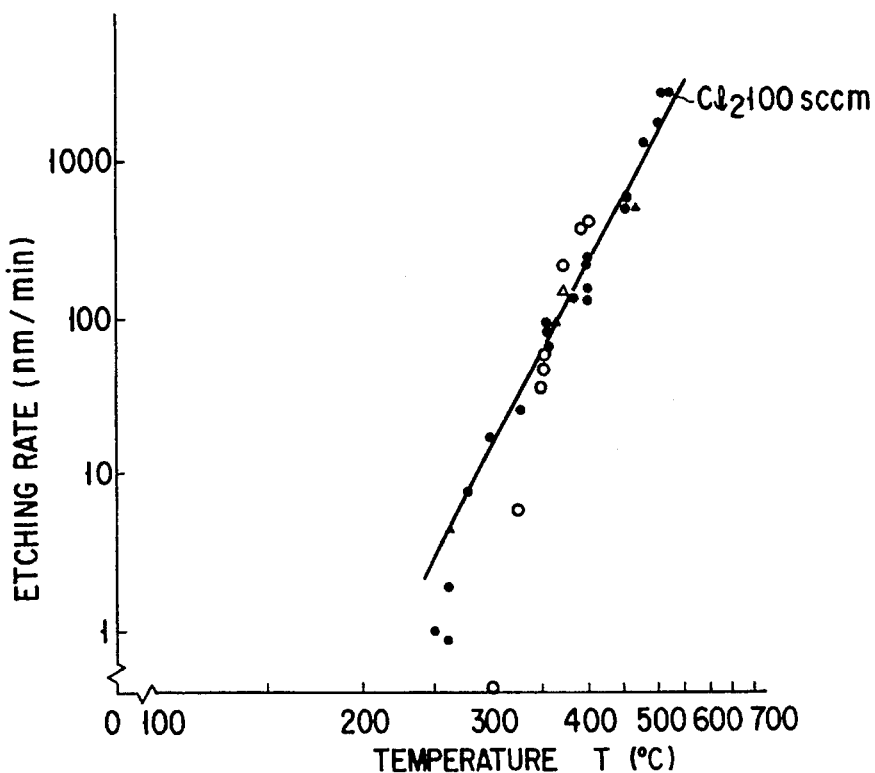
F I G. 3
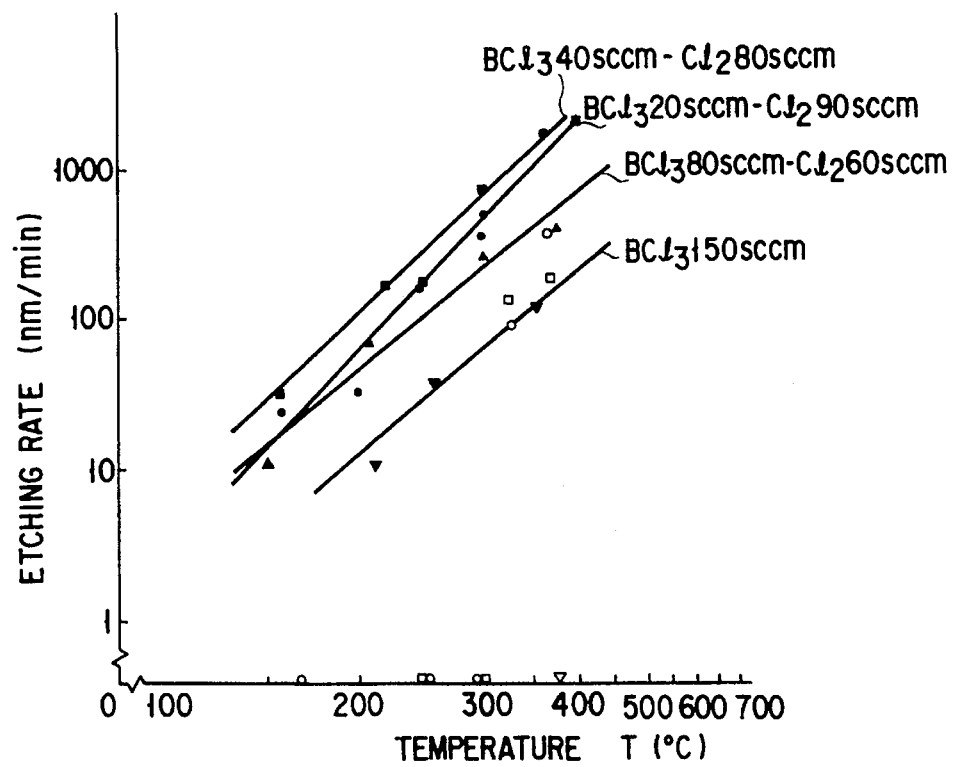
F I G. 4

METHOD OF PROCESSING A MAGNETIC THIN FILM

BACKGROUND OF THE INVENTION

1. Field of the Invention

The present invention relates to a method of processing a magnetic thin film consisting of a magnetic material containing Fe, Co or Ni.

2. Description of the Related Art

A magnetic thin film consisting of a magnetic material containing Fe, Co, or Ni has been conventionally used in a wide variety of magnetic devices such as a magnetic head, magnetic disk, magnetic bubble memory, magneto-optical disk, magnetic sensor and thin film inductor. Furthermore, future application of the magnetic thin film to a magnetic random access memory (MRAM) or spin polarization effect (SP) device is expected. To manufacture these magnetic devices, particularly, to make a thin film magnetic head, magnetic sensor, magnetic bubble memory, thin film inductor, MRAM, and SP device, a desired patterning of the magnetic thin film must be performed. Moreover, if the desired pattern of the magnetic thin film can be performed in manufacturing the magnetic disk or magneto-optical disk, the pattern can be used as a recording track having a shape anisotropy.

Hitherto, to process a magnetic thin film into a desired pattern, ion milling has been mostly employed. The ion-milling is a method using an inert gas such as Ar, which is ionized and accelerated so as to bombard the magnetic thin film. In the ion milling method, an etch rate increases with an increase in an ion density, and also anisotropic processing can be attained if a bombardment angle of ions is set appropriately. However, the ion milling method has not etch selectively, so that it is difficult to process the magnetic thin film having a considerable thickness. In addition, to process a large-size magnetic thin film in its entirety, a large-scale ion source is required. The use of a large-scale ion source is undesirable from an economical point of view and the scaling-up of an ion source entails a technical limit. Furthermore, during processing, part of the processed material is ejected into a gaseous phase and redeposition thereof onto the sidewalls of a mask is caused. As a result, it is difficult to form a fine pattern accurately.

To form a thin film magnetic head, a magnetic thin film having a predetermined pattern is formed directly by a plating method. A representative example is NiFe plating applied to the inside of a resist frame pattern. However, the plating method is disadvantageous in the following points: It is difficult to supply the plating material constantly to the pattern-forming region, so that the compositions of the plating solution inside and the outside of the pattern-forming region become different with the passage of time. Hence, it is conceivable that the plating method may not deal with the up-and-coming needs for forming a magnetic thin film pattern of submicron order.

In the meantime, a plasma etching method, especially, a reactive ion etching (RIE) has been studied with the intention of applying it in the magnetic thin film processing. The RIE is mostly used in an LSI fabrication process by virtue of its excellent etch selectivity and economical advantages. In the LSI fabrication process, RIE makes it possible to form a fine pattern since the activated reactive gas reacts with a generally-used LSI material and easily produces a reaction product having high vapor pressure. Whereas, in the case of processing a magnetic thin film by RIE using the same reactive gas generally used in the LSI process, the product resulting from the reaction between the reactive gas and a magnetic material has low vapor pressure. Therefore, the magnetic thin film must be heated to high temperature to form a fine pattern, which prevents RIE from practical application to processing the magnetic thin film.

For example, processing of a magnetic thin film consisting of Fe—Si—Al by RIE using an activated chlorine-based gas is reported in IEEE Trans. Magn. 27 (6), 4888, 1991 and Jpn. Pat. Appln. KOKAI Publication No. 3-97877. These publication disclose $CCl_4$, $Cl_2$ and $CCl_3F$ as the chlorine-based gas. However, to process the magnetic thin film at an etch rate as high as 100 nm/min or more, a substrate has to be heated to 300° C. or more. Therefore, above method cannot be employed in manufacturing process of a magnetic device.

In the above method, removal of an etching residue has a trade-off relationship with prevention of side etching. In this case, just-etching is applied to avoid side etching and improve the patterning accuracy. However, the just-etching leaves a residue, so that further treatment is required thereafter to remove the residue. Hence, the above method is not practical.

Another technique for use in processing magnetic thin film consisting of the magnetic material containing Fe, Co or Ni is disclosed in Jpn. Pat. Appln. KOKAI Publication No. 4-129014. In this method, the magnetic thin film is processed by supplying a gas mixture of a rare gas and $Cl_2$, $CCl_4$, $CHCl_2F$ or $CCl_2F_2$ to the exposed portion of the magnetic thin film. However, this method is not practical, since the etch rate, 20 nm/min, is extremely low. In this method, a magnetic material reacts with a chlorine-based gas to produce a chloride as a reaction product on the exposed portion of the magnetic material. However, in principal, the exposed portion of the magnetic thin film is physically etched by the rare gas, and hence the etch selectivity is low. In addition, due to the redeposition of processed material, the accuracy of processing is lowered.

SUMMARY OF THE INVENTION

An object of the present invention is to provide a method for processing a magnetic thin film, which has an excellent etch selectivity, economical advantages and is capable of accurately forming a fine pattern at low temperature and a high rate even if a large-size magnetic-thin film is used.

The method of processing a magnetic thin film of the present invention comprises the steps of:

disposing a mask having a predetermined pattern on a magnetic thin film consisting of a magnetic material containing at least one element selected from the group consisting of Fe, Co and Ni;

supplying a reactive gas containing activated $BCl_3$ to an exposed portion of said magnetic thin film and allowing said reactive gas to react with said magnetic material; and removing the magnetic thin film of the exposed portion to perform a desired patterning.

To be more specific, the present invention provides a method of processing a magnetic thin film by taking advantage of a chemical reaction such as reactive ion etching (RIE), or chemical dry etching (CDE), which is characterized in that activated $BCl_3$, for example, plasma-state $BCl_3$ is used as a reactive gas.

BRIEF DESCRIPTION OF THE DRAWINGS

FIG. 1 is a schematic view showing the structure of the RIE apparatus used in carrying out the present invention;

FIG. 2 is a sectional view showing the structure of a sample used in carrying out the present invention;

FIG. 3 is a diagram indicating the experimental results of CoZrNb and Co films which are processed by using pure $Cl_2$;

FIG. 4 is a diagram indicating the experimental results of CoZrNb films processed by using pure $BCl_3$ or a gas mixture of $BCl_3$—$Cl_2$ activated by electrical discharge;

DETAILED DESCRIPTION OF THE PREFERRED EMBODIMENTS

Figure 5:
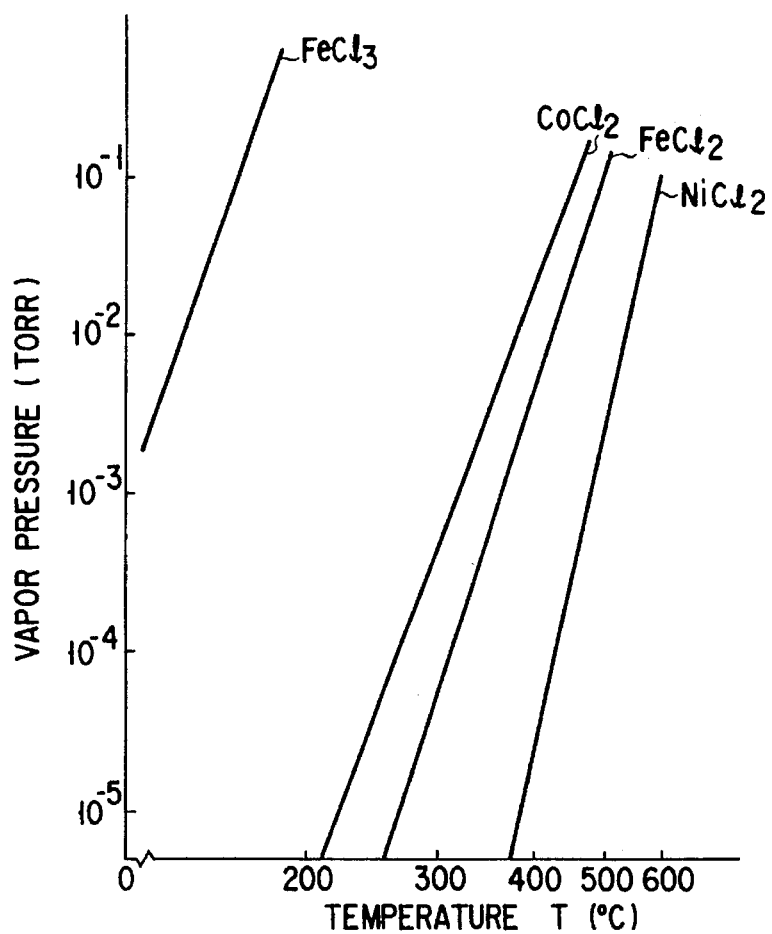
FIG. 5 is a diagram showing vapor pressure curves of chlorides of Fe, Co and Ni.

A magnetic thin film for use in the present invention will not be particularly restricted as long as it is made of a magnetic material containing at least one element selected from the group consisting of Fe, Co and Ni as a main component. Specific examples of the magnetic material include a simple metal consisting of Fe, Co or Ni, alloys such as NiFe, CoFe, FeSiAl, CoZrNb, FeN, CoFeN, CoFeSiB, FeTaN, FeB, and FeCoZr. Although the method of forming the magnetic thin film is not particularly restricted, representative one is a sputtering method. Use may be made of a variety of the sputtering methods such as rf sputtering, magnetron sputtering, ion-beam sputtering, and reactive sputtering. Other than sputtering, evaporation, MBE, ICB, and MOCVD may be used.

In the present invention, a substrate on which a magnetic thin film is formed is not be particularly restricted. Generally, a ferrite substrate, glass substrate, silicon substrate and various ceramic substrates may be used. A resin substrate may be used in the present invention, since the magnetic thin film can be processed at low temperature. In the case where a substrate is susceptible for etching by a reactive gas, a film serving as an etch stopper may be formed between the substrate and the magnetic thin film.

In the present invention, on the magnetic thin film formed on the substrate, a mask having a predetermined pattern is placed. Examples of the mask include resist, carbon, silicon oxide, aluminum oxide, silicon nitride, aluminum nitride and the like. Of the mask materials, resist is particularly preferable due to its simple manufacturing process. However, the resist is only durable to heat up to a temperature of about 150° C. When a magnetic thin film is processed at a temperature in excess of 150° C., a heat resistant mask is used as follows. First, on the magnetic thin film, a film made of silicon oxide or aluminum oxide is formed. On the film thus formed, a resist having a predetermined pattern is further formed. The exposed portion of the film made of silicon oxide or aluminum oxide is etched, thereby transferring the resist pattern into the film. Thereafter, the resist is removed by ashing or the like. As a next step, the magnetic thin film is processed using the patterned film made of silicon oxide or aluminum oxide as a mask.

The methods for use in activating the reactive gas include an electrical method such as plasma discharging, an optical method such as ultraviolet-ray irradiation, and a thermal method such as heating. These methods may be used simultaneously. However, it is preferable to use at least the electrical method such as plasma discharging so that a plasma-state reactive gas is supplied to the exposed portion of the magnetic thin film.

Hereinbelow, we will explain the mechanism of removing the magnetic thin film from the exposed portion by supplying the reactive gas containing activated $BCl_3$ according to the present invention, in comparison with the mechanism of conventional techniques.

In the conventional technique, when a chlorine-based gas such as $Cl_2$ is supplied as a reactive gas and activated, chlorine ions or radicals are generated. Then, the chlorine ions or radicals thus generated react with an exposed magnetic thin film to produce a chloride thereon. However, the thus formed chloride is hard to be removed physically by the chlorine ions or radicals. In this case, the activation energy for removing the chloride from the exposed portion of the magnetic thin film greatly depends on the vaporization energy of the chloride. However, of the chlorides thus formed, particularly, chlorides of Co and Ni and Fe (II) do not have much higher vapor pressure at a temperature of 300° C. or less. Therefore, to process the magnetic thin film at a high etch rate, the temperature must be raised to about 400° C. or more. When the magnetic thin film is processed at a high temperature of 400° C. or more, the exposed magnetic thin film is removed mostly depending on thermal reaction and vaporization of the chloride despite of the presence of activated chlorine ions or radicals. As a result, anisotropic processing, which is basically attained by RIE, is hardly carried out.

In contrast, in the present invention, when a gas containing $BCl_3$ is supplied as a reactive gas and activated, chlorine ions or radicals and B—Cl-based ions or radicals are produced. Of these products, the chlorine ions or radicals react with a magnetic material upon being supplied to the exposed portion of the magnetic thin film and then provide chlorides of Fe, Co and/or Ni similarly to the case where $Cl_2$ alone is used as the reactive gas. On the other hand, the B—Cl-based ions or radicals accelerate chemically and physically the generation and removal of the chlorides of Fe, Co and/or Ni, which are the reaction products between chlorine ions or radicals and the magnetic material. By virtue of this mechanism, the activation energy required for removing the chlorides can be markedly lowered and therefore the magnetic thin film can be processed at a very high rate even at low temperature. To reiterate, since the method of the present invention employs the reactive gases capable of producing a reaction product by reacting with the magnetic material and capable of accelerating chemically and physically the generation and removal of the reaction product, the anisotropic processing of the magnetic thin film can be performed accurately at a high etch rate even at low temperature.

When the activated $BCl_3$ gas is used as in the present invention, a denaturated layer containing boron, probably a boride of the magnetic material, is formed on the sidewalls of the pattern of the magnetic thin film. The denaturated layer is capable of blocking the etching of the sidewalls of the pattern of the magnetic thin film, so that anisotropic processing can be performed more excellently. The denaturated layer protects the magnetic thin film having poor corrosion resistance and improves the adhesiveness of the magnetic thin film to a non-magnetic film formed between the magnetic thin film patterns. Consequently, corrosion is suppressed in and after the processing of a magnetic thin film. Therefore, the magnetic device having the pattern of the magnetic thin film processed in the aforementioned manner will have an improved reliability.

When the active species of carbon chloride such as $CCl_4$ are supplied to the exposed portion of the magnetic thin film, C—Cl-based ions or radicals are generated together with chlorine ions or radicals. The C—Cl-based ions or radicals accelerate chemically and physically etching of the chloride produced on the exposed portion of the magnetic thin film, in the same manner as in the case of the B—Cl-based ions of the present invention. However, when the magnetic thin film is processed in the presence of the C—Cl-based ions or radicals, carbon is liable to be deposited on the etching surface. The carbon once deposited is hardly removed. In the consequence, the magnetic thin film cannot be processed accurately at a high etch rate. In addition, significant pollution will be caused by the carbon chloride gases and their active species.

In the method of the present invention, activated $Cl_2$ may be used together with activated $BCl_3$. When $BCl_3$ and $Cl_2$ are used together, the density of chlorine ions or radicals contained in the reactive gas increases, so that the magnetic thin film can be processed at a high rate even at lower temperature. To explain more specifically, if $BCl_3$ alone is used as the reactive gas, the chlorine ions or radicals will not be sufficiently generated, with the result that reaction between the chlorine ions or radicals and the magnetic material is not sufficiently performed. Due to the insufficient reaction, a large amount of a subchloride having a low vapor pressure is generated, which probably remains as a residue after processing. In contrast, when $BCl_3$ and $Cl_2$ are used together, the subchloride is partially converted into a chloride having a stoichiometrical composition. By this, the vapor pressure of the reaction product is increased and the activation energy of vaporization is decreased. As a result, the residue is greatly suppressed, improving the accuracy of the processing. Therefore, the highly accurate processing can be performed at a high etch rate even at low temperature.

In the present invention, when $BCl_3$ is mixed with $Cl_2$, $Cl_2$ is used in the range from 0 to 90 vol %, preferably from 40 to 85 vol %, more preferably in a volume of approximately 70 vol % based on the total volume of $BCl_3$ and $Cl_2$. The mixing ratio of $BCl_3$ to $Cl_2$ may be set to a value within the aforementioned range by regulating flow rates of the gases introduced into a reaction chamber. The aforementioned range of the $Cl_2$ content is determined on the basis of the following reasons: If the volume of $Cl_2$ is extremely low, it will not be possible to suppress the residue of a subchloride effectively. On the contrary, if the volume of $Cl_2$ is excessively large, it may not be possible to accelerate the generation and removal of the chlorides of Fe, Co, and/or Ni by B—Cl-based ions or radicals. Note that there are gases, other than $Cl_2$, generating chlorine ions or radicals by being activated but at least the carbon chloride gas such as $CCl_4$ should be excluded in view of the pollution problem. The $Cl_2$ has no problem of pollution, so that the waste gas from the activated $Cl_2$ can be treated in a simple step. $Cl_2$ is preferable also in this respect.

In the present invention, a depositing gas may be used together with activated $BCl_3$ and $Cl_2$. The depositing gas is referred to a gas from which active species are dissociated by excitation in the plasma and deposited on the sidewalls of the pattern of the magnetic thin film, directly or in the form of a compound with $BCl_3$ or a constitutional element of the magnetic thin film. Examples of the depositing gas include $SiCl_4$, $O_2$, $N_2$, CO, $TiCl_4$, $CH_2F_2$, $CH_3$ and the like. The deposited film on the sidewalls of the pattern of the magnetic thin film varies depending on the types of the depositing gases employed. To be more specific, amorphous Si is deposited when an $SiCl_4$ gas is employed; an oxide of the constitutional element of the magnetic thin film in the case of an $O_2$ gas; a boric nitride which is a reaction product between $BCl_3$ and $N_2$ in the case of an $N_2$ gas; an oxide of carbon or a constitutional element of the magnetic thin film in the case of a CO gas; and Ti in the case of a $TiCl_4$ gas. When the depositing gas is used together, the deposited film is hardly formed on an etching surface of the magnetic thin film which is susceptible to ion bombardment. The deposited film is rather likely to be formed selectively on only the sidewalls of the pattern of the magnetic thin film. Such a deposited film has a function of blocking the etching of the sidewalls of the pattern of the magnetic thin film. Owing to this function, anisotropic processing can be performed more accurately. Furthermore, the deposited film thus-formed protects the magnetic thin film having low corrosion resistance and improves adhesiveness of the magnetic thin film to non-magnetic thin film formed between the magnetic thin film patterns, with the result that corrosion can be suppressed in and after processing of the magnetic thin film. Therefore, a magnetic device using the pattern of the magnetic thin film thus formed will have improved reliability.

Of the depositing gases mentioned above, $SiCl_4$, $O_2$, $N_2$ and CO are preferable in view of simplicity of handling, etch selectivity to mask, etch rate along the film-thickness direction, and processability at low temperature. $SiCl_4$ and $TiCl_4$ are preferable because they generate a large amount of chlorine ions or radicals in a reactive gas when excited in the plasma.

$SiCl_4$ is most preferable since it will provide a sufficiently stable film if used together with $BCl_3$. If $SiCl_4$ is used alone, dissociated species from $SiCl_4$ are usually deposited as amorphous Si. However, the deposited amorphous Si film is susceptible to etching by chlorine ions or radicals resulting from activated chlorine-based gas, so that it is poor in stability. However, when $SiCl_4$ is used together with $BCl_3$, boron-doped p-type amorphous Si (p-Si) is deposited. The deposited p-Si may be a quite stable since it scarcely receives electrons from chlorine radicals.

Of the depositing gases mentioned above, $O_2$ is particularly efficient in processing a magnetic thin film containing an oxidation-susceptible element as a constitutional element. For example, the oxide of Zr can be easily deposited on the sidewalls of the pattern of the magnetic thin film formed of CoZrNb containing Zr, and the oxides of Si and Al are deposited in the case of using an FeSiAl film containing Si and Al.

When CO is employed as a depositing gas, CO acts as a reducing agent for chlorides of Fe, Co and Ni, which are reaction products between activated $BCl_3$ or $Cl_2$ and the magnetic material. For this reason, the chlorides of Fe, Co, and Ni are partially converted into a carbonyl compound having an extremely high vapor pressure. As a result, the processing of the magnetic thin film can be made at much lower temperature and a fairly higher rate. In this case, it is effective to supply an active metal having a catalytic activity to a carbonylation reaction of the chloride of Fe, Co or Ni to the exposed portion of the magnetic thin film together with CO, since the conversion rate of the chloride into a carbonyl compound is increased. Examples of the active metal include Li, Na, K, Rb, Cs, Mg, Al, Zn, Cu and the like. The active metal can be used alone or in the form of a compound, for example, a hydride such as lithium hydride, an amalgam such as sodium amalgam, an organic metal such as organic lithium or organic aluminum. The compounds listed above may be used in any form such as solid, liquid or gas. To supply the catalytic element to the exposed magnetic thin film, the active metal or its compound is fed into the reaction chamber accommodating a sample having the magnetic thin film through a gas inlet or is disposed near the sample.

A plurality of depositing gases may be used in appropriate combination. In particular, when $SiCl_4$ or $TiCl_4$ is used together with $O_2$, an oxide of Si or Ti is deposited. When $SiCl_4$ or $TiCl_4$ is used together with $N_2$, a nitride of Si or Ti is deposited. In the case where $SiCl_4$ or $TiCl_4$ is used together with $N_2O$, $NH_3$ and the like in place of $O_2$ and $N_2$, similarly, an oxide and a nitride of Si or Ti are deposited. However, to simplify the treatment of a waste-gas, the use of $O_2$ and $N_2$ are rather preferable.

In the present invention, the depositing gas is contained preferably in the range of 5 to 30 vol %, more preferably in a volume of about 15 vol % based on the total volume of $BCl_3$ and $Cl_2$. This is determined based on the following reasons: If the content of the depositing gas is low, a deposited film cannot be completely formed on the sidewalls of the pattern of the magnetic thin film. On the contrary, if the content of depositing gas is high, an etch rate may decrease since the deposited film is formed on an etching surface of the magnetic thin film. In the case where $SiCl_4$ is used together with $O_2$ or $N_2$, $SiCl_4$ is preferably contained in the depositing gas in a volume of about 25 to 75 vol %.

The reactive gas containing $BCl_3$ used in the present invention may be diluted with a carrier gas consisting of a rare gas such as He, Ne, Ar, Kr or Xe or $H_2$, and then introduced into a reaction chamber. If the rare gas such as Ar is accelerated by electrical energy and supplied to the exposed magnetic thin film, the processing time will be shortened. The rare gas thus accelerated etches a mask physically. Part of the etched mask material is redeposited on the sidewalls of the pattern of the magnetic thin film.

In the present invention, a processing temperature is preferably set in the range from 100° C. to 300° C. When the processing temperature is 100° C. or more, the magnetic thin film can be processed at a etch rate sufficiently high for practical use. If the processing is not necessarily performed at a high rate, the processing of the magnetic thin film may be performed at a temperature below 100° C. Whereas, the processing is carried out at a temperature below 100° C., the residue consisting of a subchloride, etc., as mentioned above, tends to be produced in a large amount. On the other hand, if the processing temperature exceeds 300, thermal reaction and vaporization will be performed dominantly in the exposed portion of the magnetic thin film, so that anisotropic processing may not be performed sufficiently. In other words, if the processing temperature exceeds 300° C., etching of the exposed portion of the magnetic thin film will proceed depending upon the thermal reaction and vaporization even though the reactive gas is not activated. On the contrary, if the processing temperature is 300° C. or less as in the present invention, the thermal reaction and vaporization will not cause any substantial problem and anisotropic processing is performed sufficiently by the reactive gas activated by discharge. Moreover, since the substrate and film used in a general magnetic device is not degraded at a temperature 300° C. or less, the method of processing the magnetic thin film of the present invention performed at temperature of 300° C. or less, can be applied to a wide variety of magnetic devices.

In the present invention, to perform desired anisotropic processing, it is preferred that the density and energy of the plasma should be controlled appropriately. More specifically, a discharge density (plasma density) over the magnetic thin film is preferably set in the range of 1 to 10 $W/cm^2$. A cathode fall voltage formed near the surface of the magnetic thin film is preferably set in the range of 0.5 to 2.5 kV. This is determined based on the following reasons: If the magnetic thin film is processed at a temperature near 300° C. under the condition that a discharge density is less than 1 $W/cm^2$ or a cathode drop voltage is less than 0.5 kV, thermal reaction and vaporization will be performed dominantly in the exposed portion of the magnetic thin film. As a result, anisotropic processing is often performed insufficiently. On the contrary, if the magnetic thin film is processed under severe discharging condition such that the discharge density exceeds 10 $W/cm^2$ or a cathode fall voltage exceeds 2.5 kV, the magnetic thin film will be damaged and physical etching will proceed faster, with the result that a sufficient etch selectivity to a mask may not be obtained. Note that it is desirable that as the processing temperature of a sample decreases, the discharge density should be set higher. For example, when the processing temperature is as low as 100° C., a preferable discharge density should be set to 2 $W/cm^2$ or more. The discharge density and cathode drop voltage herein are dependent on the pressure of gas introduced to a reaction chamber. According to the method of the present invention, if two of three conditions of gas pressure, discharge density and cathode drop voltage are set, remaining one is automatically determined. More specifically, if the discharge density and cathode drop voltage are set to the aforementioned conditions, the gas pressure of a reaction chamber may be approximately 5 to 50 Pa.

The pattern of the magnetic thin film formed according to the method of the present invention can be applicable to various magnetic devices. In forming the pattern, if a deposited film (first deposited film) is formed on the sidewalls of the pattern of the magnetic thin film, anisotropic processing can be advantageously performed. The first deposited film protects the magnetic thin film of low corrosion resistance and improves the adhesion characteristics of the non-magnetic film (second deposited film) formed between the magnetic thin film patterns, so that the corrosion in and after processing of the magnetic thin film will be successfully suppressed.

The first deposited film is made of the reaction product of the depositing gas or a sputtered mask material as described in the above. The first deposited film can be made on the sidewalls of the magnetic thin film pattern simultaneously upon the initiation of patterning.

In the present invention, to improve the reliability of the magnetic thin film without decreasing its productivity, the thickness of the first deposited film preferably falls in the range of 1 to 200 nm, more preferably 50 nm or less. The angle (taper angle) formed between the first deposited film and the underlying layer is preferably 80° or less. If the angle exceeds 80°, it is difficult to improve the step coverage of the second deposited film such as an insulating film formed later. On the other hand, it is difficult to form the first deposited film so as to have an angle of less than 45° with the underlying layer. For this reason, the preferable taper angle should be within the range of 45° to 80°.

To manufacture a magnetic device, after the formation of the first deposited film, the second deposited film is formed on the outer side of the first deposited film. To form the second deposited film, a sputtering method is generally employed. To form the second film at a high rate, the film surface should be set perpendicularly to the incident direction of sputtered material. The second deposited film is generally made of an insulating material but is not particularly restricted. It is critical that the material of the first deposited film is different from that of the second deposited film, or that even if the same material is employed, the structures of both films must be different. The film structure herein is referred to the states of crystallization, microscopic form, chemical bonding and the sequence of neighboring atoms and the like. Such a film structure can be analyzed by ED, sectional SEM, TEM, XPS, EXAFS and the like.

Hereinbelow, the embodiment of the present invention will be explained with reference to the drawings.

FIG. 1 is a schematic view of the RIE apparatus used in carrying out the present invention. In FIG. 1, reference numeral 1 is a reaction chamber, 21 is a discharge cathode, 22 is a sample holder, 3 is a sample, 4 is capacitively coupled radio frequency power supply, 5 is a counter electrode, 61 is a gas source, 62 is a gas flow regulator, 63 is a gas supply ring, 71 is an infrared ray lamp for sample heating, 72 is a lamp housing for conversing light, 73 is a quart window for transmitting an infrared ray, 8 is a gas exhausting system, 9 is a monitor for cathode drop voltage, 10 is a monitor for sample temperature, and 11 is a gas pressure gauge.

The reaction chamber 1 made of stainless steel has anodized aluminum plates on the inner walls for preventing corrosion with a chlorine-based gas. The cathode 21 made of stainless steel is covered with an anodized aluminum cylinder. The sample holder 22 is formed of a quart plate of 18 cm in diameter.

The capacitively coupled radio frequency power supply 4 has a frequency of 13.56 MHz and a maximum power of 4 kW, which is capacitively coupled to the discharge cathode 21 in order to generate a cathode drop voltage in the vicinity of a sample holder 22. The counter electrode 5 is an anodized Al ring. To the center of the ring, mesh is provided in order to apply an infrared ray to the sample 3. Since the counter electrode 5 is used for controlling the discharge density on the sample 3 uniformly, it may not be necessarily employed.

The gas source 61 comprises individual gas bombs of $BCl_3$, $Cl_2$, $SiCl_4$, and CO which are housed in a cylinder cabinet and gas bombs of $O_2$ and $N_2$ which are housed in a bomb stocker placed outside the cylinder cabinet. These gas bombs are connected to the gas flow regulator 62 in way of a stainless steel pipe equipped with a pressure regulator. To each of gas lines of the gas bombs housed in the cylinder cabinet, a nitrogen line for purging is connected. All the gas lines are purged by nitrogen when the reaction chamber 1 is not in operation. The gas lines are independent of each other until they pass through the gas flow regulator 62 and coupled to each other at the outlet side of the gas flow regulator 62 and then introduced to the reaction chamber 1. In addition, a bypass line is provided so as not to pass through the reaction chamber 1. By the bypass line, these gas lines are connected directly to the gas exhausting system 8. Furthermore, an $N_2$ gas line is separately provided in order to purge the reaction chamber.

The gas supply ring 63 is made of a circularly formed stainless steel pipe having a large number of 2 mm-diameter holes. The gas supply ring 63 makes a gas flow distribute uniformly in the gas chamber 1. Not that the gas can be introduced directly through the inlet provided to the inner wall of the reaction chamber 1, instead of providing the gas supply ring 63.

The infrared ray lamp 71 for sample heating, the lamp housing 72 for converging light, the quart window 73 for transmitting the infrared ray are provided in order to heat a small-size test sample 3 to a temperature as high as about 500° C. However, since a heating temperature is restricted to 300° C. or less, in processing a large-size magnetic thin film according to the method of the present invention, it may be practically preferred to use an infrared ray lamp power having a low degree of converging light, or to use a sheath heater embedded in the discharge cathode 21 or the sample holder 22. In the case where the sample is heated by the sheath heater embedded in the discharge cathode 21, since the quart window 73 for transmitting an infrared ray is not required, the gas can be introduced from an inlet of the upper side of the reaction chamber 1. In this case, the gas flow and discharge density can be distributed uniformly by providing a porous round plate to the gas inlet.

In the gas exhausting system 8, a dry pomp is provided in the same fashion as in a general RIE apparatus. The dry pump is capable of attaining the degree of vacuum to about 0.5 Pa. The monitor 9 for cathode fall voltage detects the output of radio frequency and high pressure resistance probe disposed to the power line of the discharge cathode 21 by means of oscilloscope. The sample temperature monitor 10 is formed as follows: A 1 mm-diameter hole is formed in the sample holder 22 disposed immediately under the sample 3. To the hole, a thermocouple is inserted. The leads of the thermocouple are taken outside the reaction chamber 1 by way of a vacuum terminal and then connected to a thermo-controller through a CR filter. The temperature of the sample 3 during discharge is controlled to an almost constant level by turning on the infrared ray lamp 71 for sample heating in accordance with the output of the thermo-controller. As the pressure gauge 11, a diaphragm type gauge having a 133 Pa head is used in couple with a Pirani gauge. More specifically, the diaphragm type gauge is used to monitor the gas pressure of the reaction chamber 1 during processing of the magnetic thin film and the Pirani gauge is used to monitor the gas pressure in the reaction chamber 1 at the time of exhausting gas.

Referring now to FIG. 2, the sample 3 to be used in the Experiments described below will be explained. In FIG. 2, which shows a sectional view of the sample 3, $SiO_2$ film 32 and a magnetic thin film 33 are successively formed on a Si substrate 31. On the magnetic thin film 33, a predetermined mask 34 is formed. The reason for using the Si substrate 31 is that it is easy to handle and to form the mask 34 thereon. However, Si is susceptible to corrosion with a chlorine-based gas. Therefore, between the Si substrate 31 and the magnetic thin film 33, a 200 nm-thick $SiO_2$ film 32 serving as an etch stopper is formed by sputtering. As the magnetic thin film 33, a $Co_{87}Zr_5Nb_8$ film is mostly used herein, however, an NiFe film, FeSiAl film, and Co film are also subjected to the Experiments. Note that the magnetic thin film 33 is formed by sputtering in any case. The mask 34 is formed on the magnetic thin film 33 as follows: First, a 200 nm-thick $SiO_2$ film is formed on the magnetic thin film 33 by sputtering. Subsequently, on the $SiO_2$ film is formed a resist pattern consisting of lines and spaces of various widths by means of general photolithography. Then, the film thus formed is placed in an RIE apparatus for processing the $SiO_2$ film. The $SiO_2$ film is etched by a $CHF_3$ gas. In this manner, a resist pattern is transferred into the $SiO_2$ film. Thereafter, the resist pattern is removed by a resist asher.

The sample 3 shown in FIG. 2 is formed when a processed shape is evaluated by a sectional SEM image, after the magnetic thin film is processed. In the case where the processed shape is not evaluated, an etch rate is determined by performing RIE to the sample 3 having a 0.5 mm-thick and 3 mm-square quart plate serving as a mask 34 on the magnetic thin film 33. The etch rates of both cases agree with each other.

In the embodiments of the present invention, the magnetic thin film of sample 3 is processed by using an apparatus shown in FIG. 1 as described in the following: First, the sample 3 is placed on the sample holder 22 of the apparatus shown in FIG. 1 and the reaction chamber 1 is then evacuated. The thermo-controller provided to the sample temperature monitor 10 is set to a desired temperature, and then the infrared ray lamp 71 for sample heating is turned on so as to raise the temperature of the sample 3. After the temperature reached a constant level, gases are introduced into the reaction chamber 1 by operating the gas source 61 and the gas flow regulator 62. Immediately after the gas pressure of the reaction chamber 1 reached a constant level, the glow plasma of the reactive gas is allowed to generate over the discharge cathode 22 by operating the capacitively coupled radio frequency power supply 4. In this way, the magnetic thin film is continuously processed for a predetermined time by RIE. Immediately after the completion of the processing, the operation of the capacitively coupled radio frequency power supply 4 and the gas supply into the reaction chamber 1 are terminated and the infrared ray lamp 71 for sample heating is turned off. After allowed to stand alone in vacuum or an $N_2$ air flow until the temperature of the sample 3 decreased to 50° C. or less, the sample 3 is taken out of the reaction chamber 1. The sample 3 having the processed magnetic thin film is subjected to the observation of a sectional SEM image and the processed shape is evaluated. The etch rate is calculated by means of a surface step profiler gauge. If necessary, the processed film is subjected to the micro-Auger electron spectroscopy analysis.

Hereinbelow, Experiments of the present invention will be described in detail. All the Experiments described below are performed by a parallel-plate RIE apparatus using capacitively coupled discharge. However, in the method of processing a magnetic thin film of the present invention, various modification may be made within the scope of the present invention. For example, RIE using magnetron discharge, RIE using inductively coupled discharge, RIE using electron cyclotron resonance discharge or the like may be used.

[Experiment 1]

In this experiment, use is made of a sample comprising a magnetic thin film formed of $Co_{87}Zr_5Nb_8$ or Co. As a reactive gas, $BCl_3$ and $Cl_2$ are used singly or in a mixed form. The magnetic thin film is processed by RIE by setting the discharge density to 1.2 W/cm$^2$ and the cathode fall voltage to about 0.65 kV while the processing temperature of the sample is being varied. The gas pressure of the reaction chamber is set to 7 to 15 Pa and the total flow rate of the gas to 100 to 200 sccm.

For comparison, control samples are processed by standing alone for predetermined time in a gas flow not activated by discharge without actuating capacitively coupled radio frequency power supply of the apparatus. The etching at the exposed magnetic thin film with respect to each of the control samples is observed, thereby determining the contribution of a thermal reaction or vaporization to the etching.

FIG. 3 shows experimental results exhibiting the relationship between temperature T and the etching rate in the case where the CoZrNb film and Co film are processed by supplying pure $Cl_2$ at a flow rate of 100 sccm. A solid circle and a solid triangle respectively indicate the results of the CoZrNb film and Co film in the case where the films are processed by using activated $Cl_2$ by discharge as the reaction gas. An open circle and an open triangle respectively indicate the results of the CoZrNb film and Co film in the case where the films are processed by introducing non-activated pure $Cl_2$ to the reaction chamber without actuating the capacitively coupled radio frequency power supply.

The activation energy Ea of etching, which can be calculated based on the slope of the graph, is about 0.9 eV. This value is not much different from the value, 1.24 eV, of vaporization energy of the reaction product $CoCl_2$. As is apparent from the above, when $Cl_2$ is used as the reaction gas, it is very unlikely that the removal of the reaction product is facilitated by activated gas. Actually, the etching rate at a temperature of 300° C. or less is as low as 15 to 20 nm/min, since the etching by the thermal reaction and vaporization is negligibly low. The high etching activation energy Ea means that the etching is greatly dependent on the temperature. In this case, to make the temperature of the sample uniform at the time of processing, it is necessary to control the processing conditions accurately. Therefore, $Cl_2$ is not suitable for processing of the large-size magnetic thin film.

In either the CoZrNb film or Co film, almost the same results are obtained. Such results are obtained on the basis of the fact that the vapor pressures of chlorides of Zr and Nb are sufficiently higher than those of Fe, Co and Ni. When the magnetic thin film containing Fe, Co or Ni as a constitutional element is processed by RIE using chlorine-based gas, the removal and vaporization of the chlorides of Fe, Co, or Ni are the rate-determining process of the etching.

On the other hand, FIG. 4 shows the relationship between the temperature T and the etching rate in the case where the CoZrNb film is processed by a pure $BCl_3$ or $BCl_3$—$Cl_2$ mixed gas activated by discharge. An inverted solid triangular, solid triangular, solid square, solid circle indicate the results of the processing performed by introducing 150 sccm of $BCl_3$; 80 sccm of $BCl_3$ and 60 sccm of $Cl_2$; 40 sccm of $BCl_3$ and 80 sccm of $BCl_3$; and 20 sccm of $BCl_3$ and 90 sccm of $Cl_2$, respectively. FIG. 4 also include the results in the case where the magnetic thin films are processed by introducing not-activated pure $BCl_3$ or gas mixture of $BCl_3$—$Cl_2$ gas without actuating the capacitively coupled radio frequency power supply. The results of the control samples are indicated by an inverted open triangular, open triangular, open square, and open circle.

The activated energy Ea of etching is calculated with respect to each of an inverted solid triangular, solid triangular, solid square and solid circle. The calculated values are respectively about 0.35 eV, 0.38 eV, 0.44 eV and 0.50 eV. These values are extremely low compared to the value of the vaporization energy, 1.24 eV, of the reaction product $CoCl_2$. These results are due to the fact that the reaction product is chemically and physically etched by B—Cl-based ions or radicals. Accordingly, the magnetic thin film can be etched by the method of the present invention at a rate sufficiently high for practical use even at a temperature of 300° C. or less.

In the cases where etching is performed by a not-activated gas, indicated by an inverted open triangular, open triangular, open square and open circle, etching by B—Cl-based ions or radicals is not performed. Neither, etching depending on the thermal reaction and vaporization is not performed at a temperature of 300° C. or less.

Of all the results of the samples processed by the method of the present invention, the result indicated by the inverted solid triangular obtained by using only $BCl_3$ exhibits the lowest activation energy Ea. However, the etching rate is higher in the case of using the $BCl_3$—$Cl_2$ mixed gas than in the case of using $BCl_3$ alone. As is apparent from the foregoing, it is effective to employ the activated $BCl_3$ together with the activated $Cl_2$ to process the magnetic thin film at a higher rate and lower temperature.

[Experiment 2]

The magnetic thin film is processed by RIE in the same manner as in Experiment 1 except that $Ni_{81}Fe_{19}$ film or $Fe_{84}Si_{10}Al_6$ is used as a magnetic thin film, a $BCl_3$—$Cl_2$ gas is used by supplying $BCl_3$ and $Cl_2$ in a flow rate of 40 sccm and 80 sccm, respectively.

When the magnetic thin film is processed using a not-activated gas, the temperature range, in which etching depending on the thermal reaction and vaporization is negligibly small, is 400° C. or less in the case of the NiFe film and 300° C. or less in the case of the FeSiAl film.

The activating energy Ea of etching is as low as 0.75 eV in the case of the NiFe film and as low as 0.50 eV in the case of the Al film. The etching rate at a temperature of 300° C. is about 100 nm/min in the case of the NiFe film and about 500 nm/min in the case of FeSiAl film. These results are inferior to those of the CoZrNb film shown in FIG. 4; however, they are good enough to put into practice. Therefore, it is confirmed that anisotropic processing can be attained at low temperature if the magnetic thin film contains any one of Fe, Co or Ni as a constitutional element.

There is a considerable difference in the vaporization energy and vapor pressure of the reaction products obtained from the reaction between Fe, Co or Ni and a chlorine-based gas. However, the etching rate of the CoZrNb film in Experiment 1 is not much different from those of the NiFe film and the FeSiAl film in Experiment 2. It is known that the values of vaporization energy of $FeCl_2$, $CoCl_2$ and $NiCl_2$ are 1.46 eV, 1.24 eV and 2.16 eV, respectively, and that the values of vapor pressure of $FeCl_2$, $CoCl_2$ and $NiCl_2$ at a temperature of near 300° C. are about $8\times10^{-3}$ Pa, $7\times10^{-2}$ Pa and $5\times10^{-6}$ Pa, respectively. For reference, vapor pressure curves of chlorides of Fe, Co, and Ni are shown in FIG. 5.

In the case of the FeSiAl film containing Fe as a main component, it is conceivable that $FeCl_3$ (vaporization energy: about 1.32 eV) having an extremely high vapor pressure of $4\times10^4$ Pa at 300° C., shown in FIG. 5, is partially produced by reacting with a chlorine-based gas and the etching rate may be improved as a consequence. However, in this experiment, even in the NiFe film containing only 19 atomic % of Fe, a high etch rate is obtained beyond the estimation based on the vaporization energy and vapor pressure of $NiCl_2$. These results cannot be interpreted on the basis of simple comparison between the vaporization energy and vapor pressure of the chloride of Fe, Co and Ni. It is presumed that the improvement of the etching rate is ascribed not only to a chemical mechanism such as the production of $FeCl_3$ but also physical etching facilitating the removal of the reaction product.

[Experiment 3]

The magnetic thin film made of $Co_{87}Zr_5Nb_8$ is processed by RIE using a $BCl_3$—$Cl_2$ mixed gas. The discharge density P, cathode drop voltage (discharge voltage) V and temperature T of a sample are varied appropriately. Proper conditions are determined on the basis of the etch rate, etch selectivity to a mask, side-etch rate, residue, and damage of the magnetic thin film obtained in this experiment.

First, it is confirmed with respect to the $BCl_3$—$Cl_2$ gas containing $Cl_2$ in the range of 40 to 85 vol % that, when the gas pressure is maintained constant, a cathode drop voltage V will be automatically determined by setting the discharge density P. Then, while the gas pressure is maintained at 10 Pa, the CoZrNb film is processed and evaluated by varying the discharge density P and temperature T. As a result, the following fact is found: As the discharge density P is increased, the etch rate is improved, the side-etch rate is decreased, and the generation of the residue is suppressed. On the contrary, the etch selectivity to a mask is decreased. In a particular case where the discharge density P is extremely high, heating caused by excessive power and damage caused by incident ions and radicals having excessively large energy are observed on the mask, the magnetic thin film under the mask, and the underlying layer of the magnetic thin film. More specifically, when the discharge density P exceeds 10 W/cm damage is observed with SEM. In excess of 15 W/cm², a significant damage is observed. The etch selectivity to a mask is 10 or more when the processing is carried out at a discharge density of 2 W/cm² and a temperature T of 300° C. The decrease in the etch selectivity with the increase in the discharge density P is due to an increase in ion sputtering caused by an increase in the cathode drop voltage V.

The side etching ratio and etching selectivity to a mask and the generation of residue also depend on the processing temperature T. In other words, the lower the temperature T, the lower the side etching ratio and the higher the etch selectivity to a mask, but the larger the residue tends to generate. In the temperature range from 100° C. to 300° C., etching is performed at a rate sufficiently high for practical use and the degree of the etching depending on the thermal reaction and vaporization is negligibly low. However, even in this temperature range, at the discharge density P of less than 1 W/cm², etching due to thermal reaction and vaporization by neutral radicals dominates in the exposed portion of the magnetic thin film. Consequently, the anisotropic processing is not performed well. Also, the residue of subchlorides having a low vapor pressure is generated in a large amount. As is apparent from the foregoing, it is clarified that preferable discharge density P falls in the range from 1 to 10 W/cm².

Next, the magnetic thin film formed of CoZrNb is processed and evaluated while the discharge density P is maintained at its critical value and the cathode drop voltage V is varied by changing the gas pressure of a reaction chamber. In the case of discharge density P of 10 W/cm², if the gas pressure is set to about 10 Pa, the cathode drop voltage V becomes about 2.5 kV, and if the gas pressure is set to 5 Pa, the cathode drop voltage V is increased to 3 kV. Under above conditions, when the magnetic thin film is processed at a temperature from 100° C. to 300° C., the mask and the magnetic thin film under the mask are damaged due to the incidence of ions or radicals having excessively large energy. However, if the gas pressure is set to 20 Pa and cathode drop voltage V is set to 2 kV, damage is not particularly observed on the mask and the magnetic thin film under the mask. From the aforementioned results, it is found that when the cathode drop voltage V exceeds 2.5 kV, the magnetic thin film is apt to receive damages.

Next, the magnetic thin film is processed by changing the gas pressure while the discharge density P is fixed to 1 W/cm². When the gas pressure is set to 7 to 15 Pa, the cathode drop voltage V becomes 0.7 to 0.55 kV. In this case, the ions or radicals incident on an etching surface had a sufficiently large energy. As a result, the anisotropic etching is performed well at a temperature T in the range 100° C. to 300° C. However, when the gas pressure is increased to 25 Pa and the cathode drop voltage is decreased to 0.38 kV, even if the density of the ions or radicals incident on the etching surface is sufficient, the energy of the ions or radicals is not sufficiently large. Therefore, the side etching ratio is very large at a processing temperature of about 300° C., with the result that anisotropic etching is hardly performed. Then, the cathode drop voltage v is set to 0.5 kV by increasing the discharge density P while the gas pressure is maintained at 25 Pa, a side etching ratio successively decreased to about one fifth even at a processing temperature of 300° C., in which a good anisotropic etching form is not likely to obtain.

Furthermore, when the cathode drop voltage V is increased to 1 kV or more, the side etching ratio is decreased to 1/20.

Note that sufficient anisotropic processing can be performed, without increasing the cathode drop voltage V to 0.5 kV, by lowering the processing temperature. However, in order to regulate the side etching ratio to 1/5 or less, which is a practically acceptable range, even at a temperature of about 300° C., it is found to be preferable to set the cathode drop voltage V to 0.5 kV or more.

[Experiment 4]

The magnetic thin film sample made of $Co_{87}Zr_5Nb_8$ is processed according to RIE by introducing a $BCl_3$—$Cl_2$ mixed gas ($BCl_3$:30 vol %, $Cl_2$: 70 vol %) together with a depositing gas into a reaction chamber. In this processing, a discharge density is set to 2 W/cm² and a temperature of the sample to 300° C., and a gas pressure to 10 Pa.

First, the CoZrNb magnetic thin film is processed by introducing only the $BCl_3$—$Cl_2$ mixed gas into the reaction chamber. The processed shape is evaluated under sectional SEM observation. As a result, the side etching ratio of the obtained pattern is 1/20. Then, the same procedure is repeated by using the $BCl_3$—$Cl_2$ gas mixture to which $SiCl_4$ and $O_2$, serving as the depositing gas are mixed in a volume of 8 vol % for each. According to the sectional SEM observation, side etching is scarcely detected on the resultant processed shape.

Furthermore, when the same procedure is repeated by using $TiCl_4$ and $N_2$ as the depositing gas instead of $SiCl_4$ and $O_2$, almost the same result is obtained. When $TiCl_4$ having a relatively low vapor pressure is used as the depositing gas, a liquid $TiCl_4$ contained in a bubbler is bubbled by a carrier gas and then introduced into a chamber.

Moreover, when each of $SiCl_4$, $O_2$ or $N_2$ is mixed alone with the $BCl_3$—$Cl_2$ mixed gas, the degree of anisotropic processing of the CoZrNb magnetic thin film is successively increased with suppressing the side etching.

[Experiment 5]

In this experiment, a magnetic thin film pattern is modeled on the recording magnetic pole in the magnetic recording head. The manufacturing steps thereof will be explained with reference to the cross sectional views shown in FIGS. 6A to 6G.

First, an Si substrate 101, which has been washed, is fixed on the substrate holder of a sputtering apparatus having multiple sputtering targets. A 200 nm-thick $SiO_2$ film 102 serving as an etch stopper is formed by sputtering the $SiO_2$ target while the substrate holder is rotated and revolved round the target. Then, a CoZrNb target is sputtered to form 2 μm-thick magnetic thin film 103 made of CoZrNb. Furthermore, an $SiO_2$ target is sputtered to form a mask material 111 made of $SiO_2$. Then, the substrate is taken out of the sputtering apparatus (refer to FIG. 6A).

After a resist pattern 112 is formed by photolithography on the mask material 111, it is placed in a dry etching apparatus. The mask material 111 is etched by a $CHF_3$ gas to form a pattern of the mask material 111 on the magnetic thin film 103 (refer to FIG. 6B).

Figure 6A:
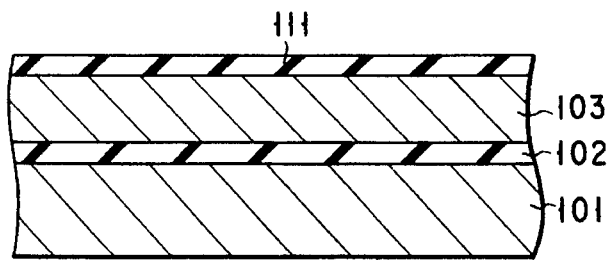
FIGS. 6A to 6G are sectional views showing a process for forming a pattern of a magnetic thin film according to the present invention.
Figure 6B:
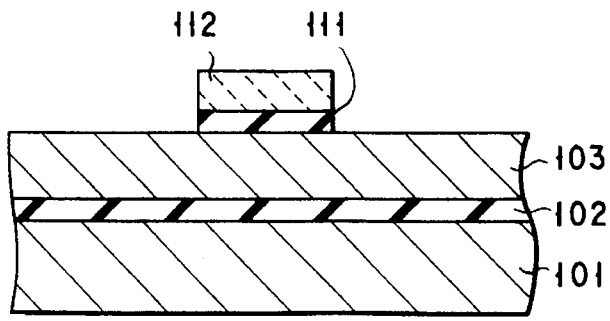
Figure 6C:
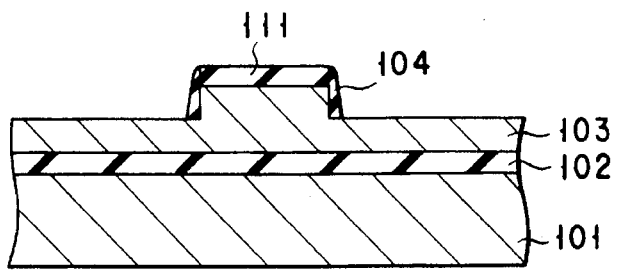
Figure 6D:
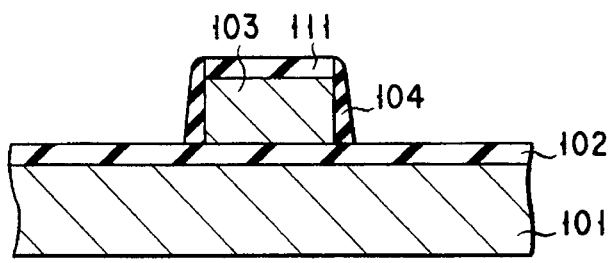

Then, the resist 112 is removed by oxygen plasma ashing. Subsequently, the sample consisting of the $SiO_2$ film 102, the magnetic thin film 103 and a pattern of the mask material 111 are successively formed on the substrate 101, is placed in an RIE apparatus. Thereafter, infrared rays are converged on the sample to set the temperature at 200° C. In this condition, the magnetic thin film 103 is processed by supplying a reactive gas containing a depositing gas. In this processing, the magnetic thin film 103 exposed to ion bombardment is removed by proceedings of thermal reaction, vaporization, and physical etching. Simultaneously, on the sidewalls of the magnetic of the thin film 103 and the mask material 111, a reaction product of the depositing gas is deposited, thereby forming a first deposited film 104. FIG. 6C shows an intermediate step of etching of the magnetic thin film.

Etching is further allowed to continue for twice as long as the time required for just-etching. The overetched sample is taken out of the RIE apparatus (refer to FIG. 6D)

In the prior art, the anisotropic shape of the magnetic thin film is usually obtained by just-etching. However, the just-etching brings a residue. In contrast, in the present invention, since the first deposited film 104 is formed on the sidewalls of the pattern, overetching does not prevent patterning in a good anisotropic shape and a process margin is notably enlarged. This feature is extremely important to perform etching of a magnetic thin film in which no residue is produced. If a plasma is distributed somewhat nonuniformly at the time of etching, the entire uniformity at a level of the large-size magnetic device can be remarkably improved.

Figure 6E:
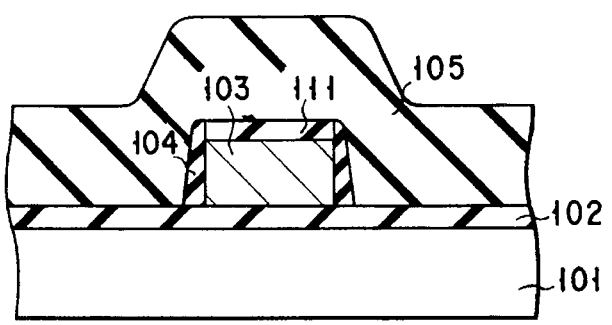

Thereafter, the sample is placed in a sputtering apparatus, a second deposited film 105 is formed over the sample by sputtering an $SiO_2$ target (refer to FIG. 6E). In this case, the taper angle between the sidewall of the magnetic thin film pattern and the underlying layer is as sharp as 85° or more. However, the taper angle between the first deposited film 104 and the underlying layer is as gentle as about 75°. This feature improves the step coverage of the second deposited film 105, adhesiveness between layers, the range of processability, and the reliability of the device.

Figure 6F:
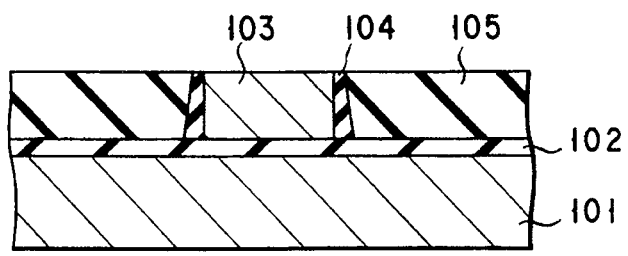

The sample having the second deposited film 105 formed thereon is polished until the magnetic thin film is exposed, thereby smoothing the upper surface of the magnetic thin film (FIG. 6F).

Figure 6G:
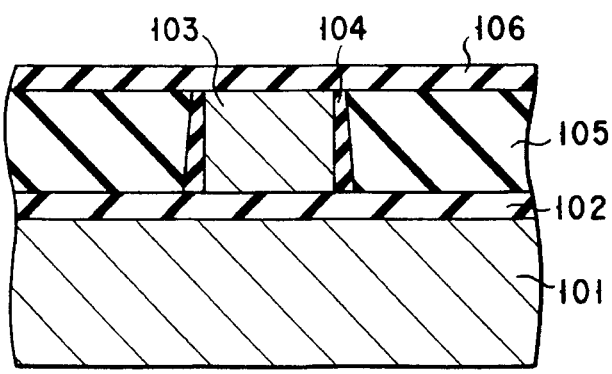

Finally, a 100 nm-thick upper insulating layer 106 made of $SiO_2$ is formed by sputtering. In this manner, a pattern shown in FIG. 6G is obtained. The portion shown in FIG. 6G corresponds to a magnetic pole pattern of one side of in-plane magnetic recording head. On this pattern, by forming the similar magnetic thin film pattern as that shown in FIG. 6G, a magnetic recording head for use in in-plane recording can be formed. In this case, the upper insulating film 106 corresponds to a magnetic gap. It is apparent that the magnetic gap can be accurately formed by this manner.

Hereinbelow, the experiment in which magnetic thin film patterns is formed by using specific reactive gas will be explained.

In this experiment, $SiO_2$ is used as a first and second deposited films, and the thickness of a mask material 111 is set to 400 nm.

In the RIE step of the magnetic thin film, a mixed gas consisting of chlorine, carbon monoxide, boron trichloride and argon is used. Individual functions of the gases used herein are as follows: Chlorine is used for forming a chloride of a magnetic material on the surface of the magnetic thin film. Carbon monoxide reacts with the chloride of the magnetic material formed on the surface to produce a carbonyl complex having a high vapor pressure and accelerates the vaporization. Boron trichloride accelerates generation and removal of the chloride of the magnetic material and traps a decomposition product of carbon monoxide, a decomposition product containing oxygen which is produced with the proceeding of physical etching of the mask material, and water-containing impurities remained in the RIE chamber. Argon is responsible for physically etching of a mask material. The etched mask material is redeposited the sidewalls of the first deposited film 104.

The RIE of the magnetic thin film 103, physical etching of a mask material 111 and redeposition of the etched mask material onto the sidewalls of magnetic thin film pattern are performed simultaneously, thereby forming an $SiO_2$ film as the first deposited film 104. The angle between the sidewalls of the magnetic thin film pattern and the underlying layer is 85° or more and the angle between the first deposited film 104 and the underlying layer is about 75°.

The first and second deposited films 104 and 105 are formed of $SiO_2$. After completion of the first deposited film 104 and the second deposited film, samples are picked up therefrom and subjected to micro-Auger analysis. As a result, both films are clearly distinct in quality. More specifically, the oxygen content relative to silicon of the first deposited film is lower than that of the second deposited film. Also, boron is detected in the first deposited film.

What is claimed is:

1. A method of processing a magnetic thin film, comprising the steps of:

disposing a mask having a predetermined pattern on a magnetic thin film consisting of a magnetic material containing at least one element selected from the group consisting of Fe, Co and Ni;

supplying a reactive gas containing activated $BCl_3$ and activated $Cl_2$, $Cl_2$ being present in an amount of 90 vol % or less based on the total volume of $BCl_3$ and $Cl_2$, to an exposed portion of said magnetic thin film and allowing said reactive gas to react with said magnetic material, the temperature of said magnetic material ranging from 100° C. to 300° C.; and removing the magnetic thin film of the exposed portion to perform a desired patterning.

2. The method according to claim 1, wherein said reactive gas is diluted with a rare gas.

3. The method according to claim 2, wherein a deposited film containing boron is formed on said sidewalls of a pattern of said magnetic thin film.

4. The method according to claim 2, wherein a deposited film containing a boride of a magnetic material constituting said magnetic thin film and part of a masking material is formed on said sidewalls of a pattern of said magnetic thin film.

5. The method according to claim 1, wherein a deposited film containing boron is formed on sidewalls of a pattern of said magnetic thin film.

6. The method according to claim 1, wherein a deposited film containing a boride of a magnetic material constituting said magnetic thin film is formed on sidewalls of a pattern of said magnetic thin film.

7. The method according to claim 1, wherein $Cl_2$ is contained in the range of 40 to 85 vol % based on the total volume of $BCl_3$ and $Cl_2$.

8. The method according to claim 1, comprising activating $BCl_3$ and $Cl_2$ by discharging to form said activated $BCl_3$ and activated $Cl_3$.

9. The method according to claim 8, wherein the temperature of the magnetic thin film is set in the range of 150° to 300° C.

10. The method according to claim 8, wherein processing the magnetic thin film is carried out with a discharge density is set in the range of 1 to 10 $W/cm^2$.

11. The method according to claim 8, wherein processing the magnetic film is carried out with a cathode drop voltage is set in the range of 0.5 to 2.5 kV.

12. The method according to claim 8, wherein a pressure of said reactive gas is set in the range of 5 to 50 Pa.

13. The method according to claim 1, additionally comprising, upon removing the magnetic thin film of the exposed portion thereby forming a pattern of the magnetic thin film, also forming a first deposited film on sidewalls of a pattern of said magnetic thin film; and forming a second deposited film on the outer side of said first deposited film.

14. The method according to claim 13, wherein said first deposited film contains boron.

15. The method according to claim 14, wherein said first deposited film contains a boride of a magnetic material constituting the magnetic thin film.

16. A method of processing a magnetic thin film comprising the steps of:

disposing a mask having a predetermined pattern on a magnetic thin film consisting of a magnetic material containing at least one element selected from the group consisting of Fe, Co and Ni;

supplying a reactive gas containing activated $BCl_3$, activated $Cl_2$ and $SiCl_4$ to an exposed portion of said magnetic thin film and allowing said reactive gas to react with said magnetic material, the temperature of said magnetic material ranging from 100° C. to 300° C.; and removing the magnetic thin film of the exposed portion to perform a desired patterning.

17. The method according to claim 16, wherein said reactive gas further contains at least one gas selected from the group consisting of $O_2$, $N_2$ and CO.

18. The method according to claim 16, wherein $SiCl_4$ is contained in the range of 5 to 30 vol % based on the total volume of $BCl_3$ and $Cl_2$.

* * * * *